United States Patent [19]

Gray

[11] Patent Number: 4,626,491
[45] Date of Patent: Dec. 2, 1986

[54] DEEP ULTRA-VIOLET LITHOGRAPHIC RESIST COMPOSITION AND PROCESS OF USING

[75] Inventor: Gary M. Gray, Pelham, Ala.

[73] Assignee: J. T. Baker Chemical Company, Phillipsburg, N.J.

[21] Appl. No.: 775,322

[22] Filed: Sep. 12, 1985

Related U.S. Application Data

[63] Continuation-in-part of Ser. No. 539,818, Oct. 7, 1983, abandoned.

[51] Int. Cl.$^4$ .......................... G03C 1/54; G03C 1/60; G03F 7/26
[52] U.S. Cl. ..................... 430/190; 430/165; 430/191; 430/192; 430/193; 430/326; 534/556
[58] Field of Search ............... 430/192, 193, 190, 165, 430/326, 191; 534/556

[56] References Cited

U.S. PATENT DOCUMENTS

| | | | |
|---|---|---|---|
| 3,046,118 | 7/1962 | Schmidt | 430/193 |
| 3,494,767 | 2/1970 | Laridon et al. | 430/193 |
| 3,647,443 | 3/1972 | Rauner et al. | 430/190 |
| 4,207,107 | 6/1980 | Ross | 430/165 |
| 4,284,706 | 8/1981 | Clecak et al. | 430/326 |
| 4,339,522 | 7/1982 | Balanson et al. | 430/192 |

Primary Examiner—Charles L. Bowers, Jr.
Attorney, Agent, or Firm—George W. Rauchfuss, Jr.

[57] ABSTRACT

Positive deep ultra-violet photoresists which are base developable comprise base soluble polymers and as photosensitive solubilizing agents oligomeric compounds of the formula

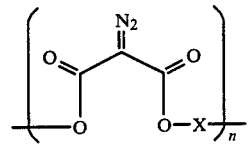

wherein X is alkylene, arylene, alkoxyalkylene or aralkylene and n is a positive integer such that the molecular weight of the oligomeric compound is from about 500 to about 3000.

16 Claims, No Drawings

DEEP ULTRA-VIOLET LITHOGRAPHIC RESIST COMPOSITION AND PROCESS OF USING

RELATED APPLICATION

This application is a continuation-in-part of my earlier copending patent application Ser. No. 539,818 filed Oct. 7, 1983, now abandoned.

FIELD OF THE INVENTION

This invention relates to deep ultra-violet photoresists compositions containing a resin and photosensitive solubilizing agents and to a process for forming a lithographic resist image employing said compositions.

BACKGROUND OF THE INVENTION

Due to the advancing state of the art in the projection or lithographic printing field, it has become highly desirable to be able to provide image geometries of less than 2 microns and very high device packing densities. In order to most advantageously obtain same, it has become highly desirable that projection imaging wavelengths in the deep ultra-violet (UV) region of below about 300 nm be employed. It is therefore desirable that suitable deep UV resist compositions be available for use with imaging wavelengths in the deep UV region.

Recently U.S. Pat. No. 4,339,522 to R. Balamson et al., issued July 13, 1982 and assigned to International Business Machines Corporation, disclosed such a deep UV resist composition which comprises phenolic-aldehyde resins sensitized with Meldrum's diazo or a homologue thereof.

A need exists for other such deep UV resists and especially deep UV resists providing for improved image resolution characteristics. Especially useful would be deep UV resist compositions providing good resolution of 0.75 micron lines or smaller.

SUMMARY OF THE INVENTION

Positive deep UV photoresists which are sensitive to light in the deep UV range of from about 240–300 nm and which are base soluble are provided by resists comprising a base soluble polymer and photosensitive solubilizing agents selected from the group consisting of oligomeric compounds of the formula

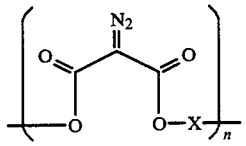

(Formula I)

wherein X is selected from the group consisting of alkylene, arylene, alkoxyalkylene, and aralkylene and n is a positive integer such that the molecular weight of the oligomeric compound is from about 500 to about 3000.

In the compounds of the above formula the alkylene, arylene, alkoxyalkylene, aralkylene preferably contain up to 20 carbon atoms. Even more preferred are those compounds of the above formula wherein the alkylene, arylene, alkoxyalkylene and aralkylene radicals contain up to 10 carbon atoms and still more preferred are those compounds wherein the alkylene, arylene, alkoxyalkylene, and aralkylene radicals contain up to 6 carbon atoms. Examples of such radicals for X are methylene, ethylene, propylene, hexylene,

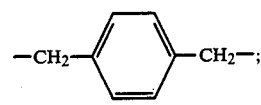

$-CH_2CH_2-OCH_2CH_2$; $-CH_2CH_2-(OCH_2CH_2)_2$ and the like.

The compounds useful as solubility inhibitors according to this invention can be easily prepared.

For example, a 2-diazomalonate ester compound of the formula

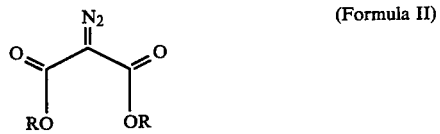

(Formula II)

wherein R is alkyl, preferably lower alkyl of 1 to 4 carbon atoms, most preferably ethyl, is reacted with an appropriate poly-alcohol or poly-phenol compound of the formula $X-(OH)_y$ wherein X is as defined hereinbefore and y is a whole positive integer selected from 2, 3 or 4, in the presence of p-toluenesulfonic acid to produce the oligomeric 2-diazomalonate ester compounds having the structure of Formula I. The reaction scheme for said preparation is as follows:

Reaction Scheme

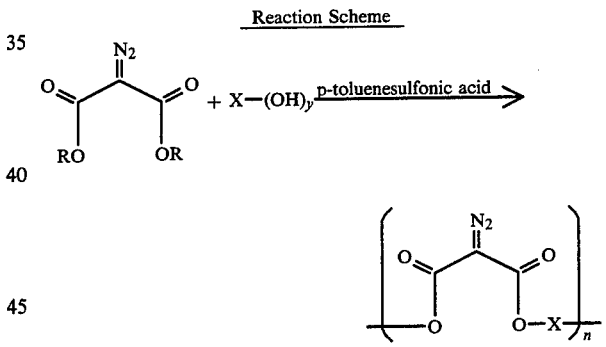

Exemplary of reactions conducted according to the Reaction Scheme are the following preparations:

A mixture of 23.0 ml (150 mmol) of diethyl malonate, 150 mmol of the desired polyalcohol or phenolic compound of the formula $X-(OH)_y$ and 1.50 g of p-toluenesulfonic acid monohydrate is heated at 150° C. under $N_2$ for 18 hours, then at 150° C. under a vacuum of 100 mm of Hg for 24 hours and finally at 160° C. under a vacuum of 0.5 mm of Hg for 24 hours. Then the polymer is taken up in 200 ml of benzene and the solution washed with 3×200 ml of a 5% aqueous sodium bicarbonate solution and 3×200 ml of deionized water before being treated with anhydrous magnesium sulfate. Following filtration, the solution is evaporated to dryness to yield the desired polymer. Following this procedure the following oligomeric 2-diazomalonate compounds of Formula I as listed in the Table were prepared.

TABLE

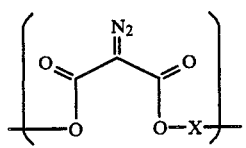

Molecurla Weight and UV Spectroscopic data for Oligomeric 2-Diazomalonate solubility Inhibitors.

| X | $MW_{max}$ (dalton)[a] | (cm$^{-1}$) (band 1) | (cm$^{-1}$) (band 2) |
|---|---|---|---|
| —CH$_2$—⟨C$_6$H$_4$⟩—CH$_2$— | 1000 | 250 | 220 |
| —CH$_2$—⟨C$_6$H$_4$⟩—CH$_2$— | 2000 | 225 | 222 |
| —CH$_2$CH$_2$— | 1500 | 252 | 230 |
| —CH$_2$CH$_2$OCH$_2$CH$_2$— | 2000 | 248 | 220 |
| —CH$_2$CH$_2$(OCH$_2$CH$_2$)$_2$— | 1000 | 248 | 220 |

[a] by gel permeation chromatography in tetrahydrofuran.
[b] no extinction coefficients calculated since the materials were oligomeric.

When the solubilizing agents of this invention are added to base soluble polymers and the resulting photoresist compositions are cast as films on substrates the solubilizing agents increase the solubility of the polymeric film in developer in the area of the film which has been exposed to the deep UV light compared to the area of the polymeric film not exposed to UV light. In the areas of the film exposed to deep UV light the solubilizing agents of this invention increase the solubility of the polymeric film to developers in exposed pattern areas.

Any suitable base soluble photoresist polymer can be employed in the photoresist compositions of this invention, such as the commercially available phenol-formaldehyde resins, cresol-formaldehyde resins, poly(vinylphenol), poly(methyl methacrylate-methacrylic acid) resins and the like. A particularly preferred resin is a poly(methyl methacrylate-methacrylic acid) resin having a methacrylic acid content of between about 20 to 30%, preferably about 25% by weight, having a molecular weight (by gel permeation chromatography) of between about 20,000 to 120,000, preferably about 80,000, and having a narrow polydispersity. Such a resin is one prepared according to the following method. A solution of 4.9 liters of the appropriate amounts of methyl methacrylate and methacrylic acid (a total of 17.5 moles of the two monomers) is stirred under N$_2$ at 80°±2° C. as 300 ml aliquots of a solution of the appropriate amount of 2,2'-diazo bis(2-methylpropionitrile) (3.5 g for a polymer with a molecular weight of 80,000 or 16.5 for a polymer with a molecular weight of 20,000) in 2100 ml of 1,2-dimethoxyethane were added at 30 min. intervals. When the addition is completed, the reaction mixture is stirred at 80°±2° C. for an additional 16 hours before being evaporated to dryness. The residue is washed with 15 liters of dichloromethane for 24 hours and then the wash is decanted and discarded. The insoluble polymer is dissolved in 15 liters of methanol and the solution is filtered. The filtrate is evaporated to dryness to yield the polymeric product.

The photoresist compositions of this invention comprise about 50 to 85% by weight base soluble polymer and from about 15 to about 50% by weight of a solubilizing agent of this invention, preferably about 70% base soluble polymer and about 30% solubilizing agent.

The resists may be formed readily by dissolving the polymer and solubilizing agent in a common solvent and casting a film onto an appropriate substrate. Any suitable film-forming solvent may be used, generally film-forming solvents having a boiling point of from about 120° to 210° C., such as for example, diglyme, methyl isobutyl ketone, 2-ethoxyethanol, 2-methoxyethyl acetate, γ-butyrolactone and the like. The resist forming composition will generally comprise from about 50 to about 95% by weight solvent and about 5 to about 50% by weight solid (i.e. base soluble polymer and solubilizing agent combined). Preferably the solvent will comprise about 80 to 85% by weight and the solids about 15 to 20% by weight. The amount of solids employed will be dependent upon the desired viscosity of the resist forming composition and is such as permits the casting of a resist of about 1 micron thick.

An especially preferred resist composition of this invention comprises about 85% by weight 2-methoxyethyl acetate solvent and about 15% by weight solids which is a mixture of (a) a poly(methyl methacrylate-methacrylic acid) of molecular weight about 80,000 in which the ratio of methyl methacrylate to methacrylic acid is 75/25 and (b) an oligomeric 2-diazomalonate of the Table wherein X is

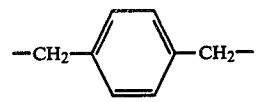

of molecular weight about 1000 daltons, wherein the weight ratio of polymer to dione solubilizing agent is 70/30.

The solubilizing agents of this invention produce photoresists of greater resist sensitivity compared to photoresist compositions containing the previously taught Meldrum's acid diazo compounds of U.S. Pat. No. 4,239,522.

A lithographic resist composition as described in the second preceding paragraph was prepared and cast as a film onto appropriate wafer substrates and pre-baked at a temperature of from about 56° to about 126° C., preferably from about 56° to about 85° C., for a period of from about 30 to about 45 minutes to drive off most of the solvent and then tested for usefulness as deep UV resists as described in the following procedure.

Using a high-pressure mercury-xenon lamp and a deep-UV filter transmitting from 240–300 nm, three-inch wafers with 150–1050 nm thick resist films were exposed through an opening 70 mm×150 mm for varying periods of time. Images were formed in the resists after developing for from about 5 to 1200 seconds in an alkaline developer, such as for example, aqueous ammonia solution, aqueous triethanolamine, aqueous ammonium acetate, aqueous tris(hydroxymethyl)aminomethane. Complete removal of resist occurred in those areas exposed to at least 150 mJ/cm$^2$ radiation.

A similar experiment can be performed using a Perkin Elmer Corporation Micralign 500 projection aligner in the UV II mode to expose resist coated wafers. Five inch wafers can be coated with resist at a thickness of 580 nm and prebaked at 95° C. for 45 minutes. No filters are to be used on the Micralign 500. The exposed wafers are to be developed for 45 sec. in pH 10 ammonia solution. Five wafers are to be exposed through an opto-line step tablet to determine the best exposure scan setting.

Then six wafers are to be exposed through a meander pattern mask at varying scan settings to measure the sensitivity of the final developed image in the resist to degree of exposure. An exposure scan setting of 14,000 (scan time of about 55 sec.) is expected to give the best image. SEM observations are expected to show that 0.75 micrometer lines and spaces are resolved.

I claim:

1. A lithographic resist composition for use with deep UV light of less than 300 nm wavelength comprising a base soluble film-forming polymer and in admixture therewith as a deep UV photosensitive solubilizing agent, a sufficient quantity of an oligomeric compound of the formula

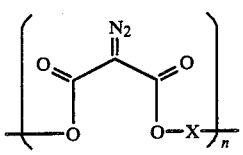

wherein X is

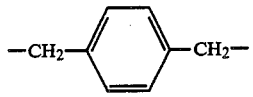

and n is a whole positive integer such that the molecular weight of the oligomeric compound is from about 300 to about 3000 daltons, whereby upon exposure to deep UV radiation the exposed composition becomes more soluble in basic developer.

2. A composition of claim 1 wherein the base-soluble film-forming polymer is a resin selected from the group consisting of phenol-formaldehyde, cresol-formaldehyde and poly(methyl methacrylate-methacrylic acid) resins.

3. A composition of claim 1 wherein the solubilizing agent is present in an amount of from about 15 to about 95% by weight based on the combined weight of polymer and agent.

4. A composition of claim 2 wherein the solubilizing agent is present in an amount of from about 15 to about 95% by weight based on the combined weight of polymer and agent.

5. A composition of claim 2 wherein the polymer is a poly(methyl methacrylate-methacrylic acid).

6. A composition of claim 5 wherein the poly(methyl methacrylate-methacrylic acid) has a molecular weight of about 80,000 and the ratio of methyl methacrylate to methacrylic acid is 75/25.

7. A castable resist composition comprising the lithographic resist composition of claim 1 in a film-forming solvent having a boiling point of from about 120° to 210° C.

8. A castable resist composition comprising the lithographic resist composition of claim 4 in a film-forming solvent having a boiling point of from about 120° to 210° C.

9. A castable resist composition of claim 8 wherein the solvent comprises from about 50 to about 85% by weight of the castable composition.

10. A castable resin composition of claim 9 wherein the solvent is selected from the group consisting of diglyme, methyl isobutyl ketone and 2-ethoxyethanol, 2-methoxyethyl acetate and $\gamma$-butyrolactone.

11. A castable resist composition comprising the lithographic resist composition of claim 6 in a film-forming solvent having a boiling point of from about 120° to 210° C.

12. A process for forming a lithographic resist image comprising image-wise exposing to deep UV light of less than about 300 nm a film cast on a substrate and dissolving the exposed portion of said film with a basic solution, wherein the film cast on the substrate comprises a film cast from the castable composition of claim 7.

13. A process for forming a lithographic resist image comprising image-wise exposing to deep UV light of less than about 300 nm a film cast on a substrate and dissolving the exposed portion of said film with a basic solution, wherein the film cast on the substrate comprises a film cast from the castable composition of claim 8.

14. A process for forming a lithographic resist image comprising image-wise exposing to deep UV light of less than about 300 nm a film cast on a substrate and dissolving the exposed portion of said film with a basic solution herein the film cast on the substrate comprises a film cast from the castable composition of claim 9.

15. A process for forming a lithographic resist image comprising image-wise exposing to deep UV light of less than about 300 nm a film cast on a substrate and dissolving the exposed portion of said film with a basic solution, wherein the film cast on the substrate comprises a film cast from the castable composition of claim 10.

16. A process for forming a lithographic resist image comprising image-wise exposing to deep UV light of less than about 300 nm a film cast on a substrate and dissolving the exposed portion of said film with a basic solution, wherein the film cast on the substrate comprises a film cast from the castable composition of claim 11.

* * * * *